United States Patent
Jensen et al.

(10) Patent No.: US 6,881,671 B2
(45) Date of Patent: Apr. 19, 2005

(54) PROCESS FOR DEPOSITING METAL CONTACTS ON A BURIED GRID SOLAR CELL AND SOLAR CELL OBTAINED BY THE PROCESS

(75) Inventors: Jens Dahl Jensen, Virum (DK); Per Møller, Esrum (DK); Nigel Brunel Mason, Camberley Surrey (GB); Richard Walter John Russel, San Agustin de Guadalix (ES); Peter Verhoeven, Vught (NL)

(73) Assignee: IPU, Instituttet for Produktudvikling, Lyngby (DK)

( * ) Notice: Subject to any disclaimer, the term of this patent is extended or adjusted under 35 U.S.C. 154(b) by 0 days.

(21) Appl. No.: 10/344,615

(22) PCT Filed: Aug. 14, 2001

(86) PCT No.: PCT/DK01/00536

§ 371 (c)(1),
(2), (4) Date: Feb. 12, 2003

(87) PCT Pub. No.: WO02/15282

PCT Pub. Date: Feb. 21, 2002

(65) Prior Publication Data

US 2003/0172969 A1 Sep. 18, 2003

(30) Foreign Application Priority Data

Aug. 14, 2000 (EP) .......................................... 00610081

(51) Int. Cl.$^7$ .............................................. H01L 21/44
(52) U.S. Cl. ..................... 438/678; 136/256; 438/73; 438/98; 438/687
(58) Field of Search ...................... 136/256; 205/118, 205/123, 184; 257/466; 438/56, 57, 73, 74, 97, 98, 678, 687, 688, 692

(56) References Cited

U.S. PATENT DOCUMENTS

| | | | |
|---|---|---|---|
| 4,726,850 A | 2/1988 | Wenham et al. | |
| 4,748,130 A | 5/1988 | Wenham et al. | |
| 5,591,565 A | 1/1997 | Holdermann et al. | |
| 6,084,175 A | 7/2000 | Perry et al. | |
| 6,224,737 B1 * | 5/2001 | Tsai et al. .................... | 205/123 |

OTHER PUBLICATIONS

G. Arabito et al., "Electroless Metallizations For Contracts In Buried Structures", $2^{nd}$ World Conference And Exhibition On Photovoltaic Solar Energy Conversion, vol. ii, pp. 1558–1561, (1998).

Shaoqi He, et al., "Laser Grooved Buried Contact Solar Cell", $2^{nd}$ World Conference And Exhibition On Photovoltaic Solar Energy Conversion, vol. II, pp. 1446–1448, (1998).

R. Kuhn, et al., "Multicrystalline Buried Contact Solar Cells Using A New Electroless Plating Metallization Sequence And A High Throughput Mechanical Groove Formation", 14th European Photovoltaic Solar Energy Conference, vol. I, pp. 672–677, (1997).

(Continued)

Primary Examiner—Asok Kumar Sarkar
(74) Attorney, Agent, or Firm—Scully, Scott, Murphy & Presser (57) ABSTRACT

A buried grid solar cell is manufactured by a process for metallising one or more metal contacts of a buried grid solar cell having a body of doped semiconductor material, wherein the electrical contact(s) is/are provided by conducting material being arranged in a pattern of one or more grooves into the semiconductor material by an electrolytic metal deposition process comprising a conventional electrolytic bath containing a special combination of per se known additives.

15 Claims, 3 Drawing Sheets

OTHER PUBLICATIONS

A.U. Ebong, et al., "A Low Cost Metallization Scheme For Double Sided Buried Contact Silicon Solar Cells", Solar Energy Materials And Solar Cells, vol. 31, pp. 499–507, (1994).

J.D. Jensen, et al., "Advances In Electrochemical Deposition Of Copper Interconnects On High–Efficiency Silicon–Based Phovoltaic Cells—A Progress Report", 16th European Photovoltaic Solar Energy Conference, (2000).

R.D. Mikkola, et al., "Copper Electroplating For Advanced Interconnect Technology", Plating and Surface Finishing, pp. 81–85, Mar. 2000.

* cited by examiner

PRIOR ART

Fig. 2

PROCESS FOR DEPOSITING METAL CONTACTS ON A BURIED GRID SOLAR CELL AND SOLAR CELL OBTAINED BY THE PROCESS

TECHNICAL FIELD

The present invention relates to a process for the metallising, i.e. deposition of metal, of one or more contacts of a buried grid solar cell having a body of doped semiconductor material, which body has two major opposing surfaces forming a light incident surface and a backside both provided with one or more electrical contacts, and which body further has one or more edges between the major opposing surfaces, wherein the electrical contact or contacts at the light incident surface is/are formed by conducting material being arranged in a pattern of one or more grooves into the semiconductor material at the light incident surface. Furthermore the invention relates to a buried grid solar cell manufactured by such a process.

BACKGROUND ART

The cost of photovoltaic (PV) solar cell production for terrestrial applications has declined 7-fold since 1980 through, innovation in manufacturing processes and improvements in product performance. However, further reductions in manufacturing costs are necessary before we can expect widespread use of PV solar cells in the renewable energy market. Accordingly, there is still a need for further cost savings in the manufacture of solar cells by improved process technology.

A common feature of all solar cells is the requirement of metal contacts to be applied to both the positive and negative surface of the device to carry the photo-generated current. The contacts must be robust, highly conducting, of low-cost and above all, simple and efficient to fabricate. Copper plated contacts are used in the fabrication of PV solar cells. The high electrical conductivity of copper is ideal for this application but the current deposition process by electroless plating is somewhat slow and inefficient. Furthermore the cost and handling of large amounts of chemicals is an increasing problem connected with electroless copper plating.

PV solar cells are generally based on the use of a doped semiconductor material. In one type of solar cells silicon is used as the semiconductor. This kind of solar cell typically comprises a pre-manufactured p-type doped silicon wafer. For the preparation of a solar cell this wafer is doped from the light incident surface to form n-type silicon at the surface. In this way a gradient interface between n-type and p-type silicon, termed a p-n-junction, is established. The p-n-junction produces the electrical field which makes the charge carriers move in one direction. To be able to conduct the electrical current away from the cell, metal contacts are provided on the cell. These contacts act as the positive and negative contact to the cell. However, by arranging metal contacts on the light incident surface these contacts reduce the active area on the light incident surface of the solar cell and thus reduce the efficiency of the cell. Accordingly it is important to minimize the shading effect of these metal contacts.

In U.S. Pat. Nos. 4,726,850 and 4,748,130 and the corresponding AU patent No. 570,309 (Green and Wenham) from 1984 a buried grid solar cell is disclosed in which the metal contacts on the light incident surface are embedded in grooves in the surface to reduce the shading effect and to improve the electrical contact with the semiconductor. In the patent specifications a number of methods for providing the metal contacts are listed. These include: sweeping of silver paste into the grooves, solder dipping and electroplating. However, the electroplating process is not exemplified in the patent specifications.

Use of a conventional electroplating process for the preparation of an embedded contact material in the type of grooves used in the above known buried grid solar cell would lead to an undesired formation of voids in the internal space of the grooves when the metal contact material is built up on exposed surfaces. Such voids will reduce the effectively as an electrical conductor. Furthermore the contact material will also build up on the electrically insulating light transparent layer in the areas adjacent to the grooves shadowing for the incident light to the solar cell and reducing its efficiency. Thus, although use of electroplating for the preparation of the embedded contacts was mentioned by Green and Wenham in 1984 this approach has not been further developed before the present invention.

In the electroplating industry it is common practice to use specific additives in the electroplating baths. Among such per se well known additives used in electrolytic copper plating are levelling additives. Levelling additives ensure a laminate growth during the build up of the electroplated layer and they are effective to level minor scratches in the basic material being electroplated. Such scratches are normally in the order of 0.1 to 5 $\mu$m width and 0.1 to 5 $\mu$m depth.

Another type of well known additives used in electrolytic copper plating are suppressing additives acting as diffusion controlled plating inhibitors. Such suppressing additives inhibit the build up of metal in areas having higher field intensity, such as at elevated areas being closest to the anode.

In *Plating & Surface Finishing*, March 2000, pp. 81–85, Mikkola et al. disclose a copper electroplating process using brighteners, levellers and suppressing agents for void-free gap fill of trenches of sub-micron dimensions used for interconnects in the area of semiconductor devices. In this article it is stressed that control of current density and additive levels has a dramatic effect on the gap fill mechanism. However, no detailed information concerning the specific composition of the electrolytic baths is given, and no information is given in case of bigger grooves such as grooves being about 20–50 $\mu$m in depth and 10–30 $\mu$m in width.

Thus, prior to the present invention a process for providing electrical contacts having good electrical conductivity and no additional shading beyond that defined by the groove dimension (width) on a buried grid solar cell, was needed.

It has now been found that it is possible to completely fill the grooves in a solar cell of the type in which grooves typically have a depth of 20–50 $\mu$m and a width of 10–30 $\mu$m using a simple electroplating technique involving a conventional electroplating bath with a special combination of per se known additives obtaining effective embedded conducts without voids and no overplating on the light incident surface outside the grooves.

BRIEF DESCRIPTION OF THE INVENTION

Accordingly the present invention relates to a process for the metallising of one or more contacts of a buried grid solar cell having a body of doped semiconductor material, which body has two major opposing surfaces forming a light incident surface and a backside both provided with one or more electrical contacts, and which body further has one or more edges between the major opposing surfaces, wherein the electrical contact or contacts at the light incident surface is/are formed by conducting material being arranged in a pattern of one or more grooves into the semiconductor material at the light incident surface, comprising the steps of a) providing the semiconductor body with a p/n-junction and an electrically insulating layer on the light incident surface and optionally on other surfaces, which layer is light transparent and not catalytic for electroless plating,
b) providing an exposed surface on one or more of the edges,
c) providing one or more grooves with a depth of 20–50 μm from the light incident surface through the insulating layer and into the semiconductor body and a width of 10–30 μm at the level of the light incident surface,
d) doping the exposed material in the grooves obtained in step c) to reestablish the p-n-junction in the material below the surface in the grooves,
e) applying a seed layer on the exposed semiconductor material in the grooves by electroless plating followed by sintering,
f) applying an electrically conducting base layer by electroless plating on top of the seed layer obtained in step d), and
g) filling the grooves with an electrically conducting contact forming material by electrolytic plating using a conventional electrolytic bath further comprising a levelling additive and a suppressing additive and using substantially constant cell voltage.

Furthermore the present invention relates to a buried grid solar cell comprising a body of doped semiconductor material having two major opposing surfaces forming a light incident surface and a backside both provided with one or more electrical contacts and which body further has one or more edges between the major opposing surfaces, wherein the electrical contact or contacts at the light incident surface is/are formed by conducting material being arranged in a pattern of one or more grooves into the semiconductor material at the light incident surface, which light incident surface is provided with an electrically insulating light transparent coating layer interrupted by the grooves, which grooves have a depth of 20–50 μm and a width of 10–30 μm at the level of the light incident surface, and have a seed layer coating the surfaces in the grooves on the top of which the grooves have an electrically conducting base layer, on the top of which the grooves again are filled with a electrically conducting contact forming material essentially without voids and no overplating on the electrically insulating light transparent layer.

A key feature of the process according to the present invention is the use of a levelling additive and a suppressing additive combined with constant cell voltage.

A further key feature according to a preferred embodiment of the invention is the method for obtaining an effective electrical contact for the electrolytic plating step by the combination of a seed layer and a following electrically conducting base layer by electroless plating both in the grooves and on at least one edge portion forming a contact to the jig of the used electrolytic plating device.

Thus, in the electroplating step according to the present invention, wherein the contact forming material is deposited, the build up of contact forming material is—due to the levelling additive and the suppressing additive—proceeding from the bottom of the groove, and the build up of contact forming material proceeds in such a way, that essentially layer upon layer of this material is deposited. The deposition essentially stops when the grooves are full.

By the prior art method of Green and Wenham mentioned above for the electroless copper plating for providing metal contacts in grooves at the light incident surface of a solar cell, the copper ions in the copper solution bath used are reduced to free metal by use of a chemical reducing agent. Typically formaldehyde or—when used as an aqueous solution—formalin is employed and the use of this compound requires special precautions for safe handling and disposal due to the health risks presented by this compound. In the method of the present invention the reduction of the copper ions to elemental copper is provided by electrons from an outside power supply and no chemical reducing agent is present and thus no such health risks exist by using the method of the present invention.

In general the method of the present invention is more environmentally safe compared to the electroless plating technique of prior art. As an example it can be mentioned that in the process of prior art about 30% of the copper in solution has to be discarded as only about 70% of the copper in the solution is deposited on the wafer whereas almost 100% of the copper in the solution employed in the process of the present invention is deposited on the wafer. The reason for the mere 70% utilisation of the copper in the prior art technique is that the copper solution has to be refreshed quite frequently. Furthermore it is very difficult to remove the copper ions from the discarded solution because of complex builders which very effectively keep the copper ions in solution. Accordingly this adds further environmental problems to the method of prior art.

Another advantage of the process of the present invention is that the plating rate is up to 30 times faster compared with the electroless technique of prior art. That is, a sufficient amount of copper metal deposition in the grooves and at other desirable locations on the wafer can be accomplished in only 3 minutes. As a result of this short processing time and due to the fact that the concentration of the copper ions in the bath are held nearly constant because the amount of deposited copper is compensated by an equal amount of copper dissolved from copper anodes this step of the method of the present invention is suitable for a continuous conveyor process.

Yet another advantage of the process of the present invention over prior art is that the chemicals used for electrolytic copper deposition in general are significantly cheaper than the chemicals used for electroless copper deposition.

Finally, prior to the electroless plating technique according to prior art, if scratches appear in the light incident surface through the dielectric layer, these scratches will automatically be plated with copper during said electroless plating process resulting in a slightly shading effect as well as an undesirable appearance. This problem does not exist for a semiconductor body that is to be plated with an electroplating process according to the present invention since the electroplating process is not an autocatalytic process as the electroless plating. Thus electrolytic plating will only take place on areas being in electrical contact with the cathode (minus pole) of the rectifier.

A rough estimate suggests that considerable cost savings is obtainable by the process of the present invention compared to the process of prior art. With an anticipated world wide increase in production of buried grid solar cells of a factor of four to five over the next five years, the advantages listed above will surely become quite beneficial in terms of economy as well as environmental concerns.

The extent of applicability of the invention appears from the following detailed description. It should, however, be understood that the detailed description with drawings and specific examples is merely included to illustrate the preferred embodiments, and that various alterations and modifications within the scope of protection will be obvious to persons skilled in the art on the basis of the detailed description.

DETAILED DESCRIPTION OF THE INVENTION

The present invention relates to an improvement of photovoltaic buried grid solar cells of the type based on a body, such as a wafer, of doped semiconductor material and provided with embedded contacts on the front surface. The invention also relates to an improvement of the process for the preparation of such solar cells.

According to a preferred embodiment the solar cells are made with doped silicon as the active semiconductor device. Usually this is in the form of a silicon wafer typically with a square form of up to 150×150 mm or a round form up to 150 mm in diameter and with a thickness of about 250–400 $\mu$m. The silicon can be a single crystal (known as monocrystalline) or can contain many small crystals (referred to a multicrystalline or polycrystalline).

The silicon wafers used usually comprise a p-type silicon wafer. The light incident surface of the wafer is doped by use of a phosphorus compound, such as $POCl_3$, at 800–900° C. to make it n-type and produce the basic p/n-junction which is the active component of the solar cell.

To enable the photogenerated free electrons to be carried away from the solar cell metal contacts are applied to the light incident front surface (the n-type surface) and to the backside surface (the p-type surface). On the front surface it is important that the contact covers a minimum of the area of this surface to enable light to pass through into the silicon.

This is ensured in the so called buried grid solar cell by an electrically conducting material embedded in grooves, which are cut in a grid pattern into the front surface of the solar cell wafer as disclosed in the U.S. Pat. Nos. 4,726,850 and 4,748,130. The embedded conducting material in the grooves forms a pattern of electrically conducting grid line members.

The grid line members should be as narrow as possible in order to minimize the portion of the light incident surface, which will be shaded by the grid line members. The smaller ratio of shaded light incident surface the higher is the cell performance. Cell performance is usually measured in terms of efficiency at standard test conditions—electrical energy out divided by total incident sunlight energy.

Before the grooves are cut into the front surface this surface is provided with a top surface coating of an electrically insulating layer, which layer is light transparent and not catalytic for electroless plating. The coating acts as an anti-reflection layer. In connection with the present invention the electrically insulating layer is of further importance because such a dielectric (non-conducting) layer will prevent metal plating on unwanted regions of the light incident front surface. In the preferred embodiment the electrically insulating layer is a silicon nitride coating on the silicon surface. An alternative electrically insulating layer may be of silicon dioxide.

The grooves are cut into the front surface of the wafer using a laser in the presently preferred embodiment. Alternatively the grooves can be mechanically formed using a diamond saw. Further alternatives comprises chemically etched grooves or plasma etched grooves.

The grooves have a depth of 20–50 $\mu$m from the light incident surface and thus penetrate through the insulating silicon nitride layer and into the semiconductor body. The width is 10–30 $\mu$m at the level of the light incident surface. In this way the p-type silicon can be exposed in the grooves and in that case it will be necessary to dope the surfaces inside the grooves to obtain n-type silicon and thus reestablish the p-n-junction.

An essential feature of the present invention is the way, in which the metal contacts are established, especially the grid line members embedded in grooves on the front surface, but in a further preferred embodiment also the contact on the backside. This establishment of electrically conducting metal contacts is also termed metallisation.

Figure 2:
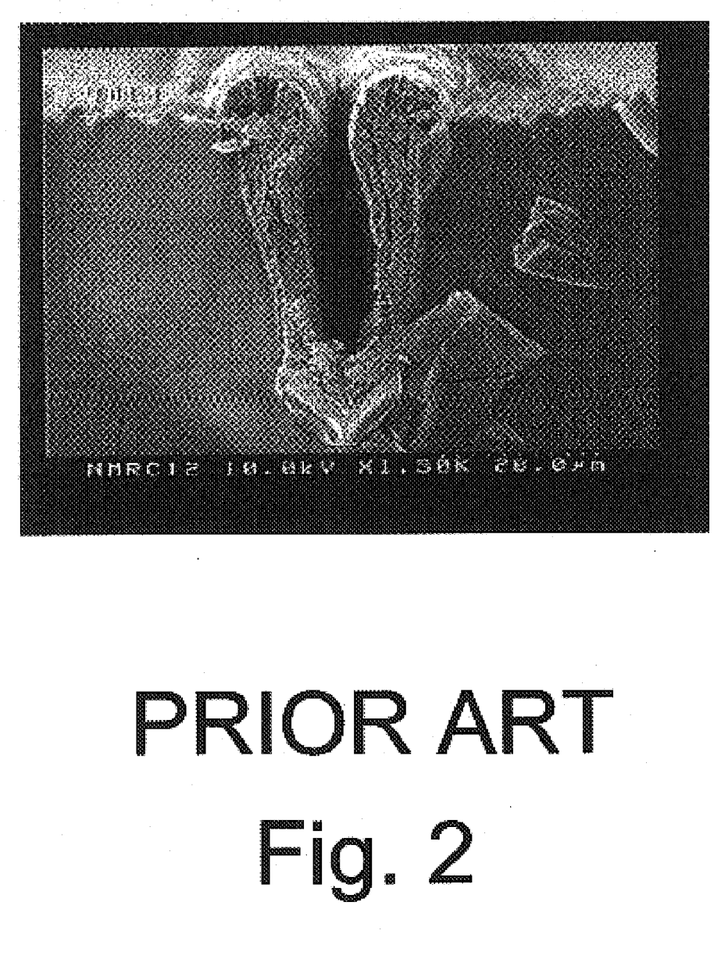
FIG. 2 is a SEM image of a groove filled by electroless copper plating according to the prior art.

In a commercial buried grid solar cell manufactured in accordance with the above mentioned U.S. Pat. Nos. 4,726, 850 and 4,748,130 the grid line members are prepared by the deposition of a thin (typically 0.1 $\mu$m) nickel seed layer by electroless nickel plating, sintering of the nickel layer to the silicon surface at a temperature of typically 400° C. in an inert atmosphere (nitrogen, argon or forming gas) to produce an ohmic contact to the silicon with high mechanical adhesion. On the top of this thin seed layer of nickel a nickel base layer of about 0.1 $\mu$m is deposited by electroless plating. Thereafter the main electrically conducting part of the grid line members is provided by the deposition of the main copper conductor (typically 5 $\mu$m) by electroless copper plating. A SEM image of an electroless copper plated groove prepared according to this commercial method is shown on FIG. 2. It appears from FIG. 2 that also the surface adjacent to the groove is overplated whereby a part of the light incident surface is shadowed. Furthermore the groove is not filled with the contact forming copper as the central part of the cross section is void. Such void part reduces the electrical conductivity of the grid line member.

Furthermore voids which have been formed during a plating process may present a hidden problem which is difficult or impossible to detect in the testing procedure following the manufacturing steps. Corrosive plating solution may be captured or enveloped in the voids and may be difficult or impossible to remove by rinsing. Such plating solution may leak later on and it may discolour and even destroy the solar cell by corroding the contacts, solderings etc.

According to the present invention the metallisation is established by first applying a thin seed layer of electroless nickel followed by sintering in the same way as by the commercial process. Then a relatively thick base layer of about 2 $\mu$m nickel is deposited by an electroless deposition process on the top of the seed layer. This base layer acts as a conductor for the copper plating to follow and may also—depending on the thickness—function as a barrier to diffusion of copper into the silicon. Finally the grooves are filled by electrolytic copper plating. As it appears from FIG. 1a it is now possible to fill the grooves without voids and without overplating of the light incident surface.

The two electroless plating steps differs from each other. Thus the purpose of the seed layer is to create a contact to the silicon as well as a seed catalysing the following plating. The term "seed layer" is not to be understood as a continuous layer covering the exposed silicon surface. Thus it will often be merely arrays of clusters of metal "grains" distributed on the exposed silicon surface. Each cluster will be a catalytic seed for the following electroless plating of a base layer, the latter being a real continuous layer. A suitable system for the preparation of a nickel seed layer is the AL100 bath from Enthone™-OMI.

The base layer has to be a layer with high conductivity which acts both as the cathode in the following electrolytic copper plating step and as a contact member between the silicon and the contact forming material in the final solar cell. This is ensured by using a low content of phosphorus in the final electroless deposit. Furthermore the base layer should have low internal mechanical stress. It would be desirable if the base layer bath is stable and easy to handle and operate. A suitable low phosphorus, low temperature, high speed, electroless process for the preparation of a nickel base layer is Enplate™ Ni 429 E bath from Enthone™-OMI.

The first application of a thin seed layer of electroless nickel is common to the known commercial process and the process according to the invention. This step requires a surface, which is catalytic for electroless plating. Such catalytic surfaces are the exposed silicon surfaces in the grooves, whereas the silicon nitride layer on the light incident surface is not catalytic for electroless plating. In order to ensure a good contact to the clamping jig of the electrolytic plating device used in the electrolytic copper plating step an exposed silicon surface is provided on at least one of the edges of the silicon wafer adjacent to at least one end of the grooves before the seed layer is applied. In this way the seed layer is not only applied in the exposed surfaces in the grooves, but also on said edge or edges. In this way the base layer on the top of the seed layer will be an electrically conductive integrated layer covering both the groove surfaces and the edge or edges in a communicating way.

In the normal cell processing sequence, silicon nitride may also be coated around the edge of the wafer. If left in place this electrically insulating silicon nitride would result in poor electrical contact to the wafer. Accordingly, to expose the silicon surface the silicon nitride is removed from the edge of the wafer, for example by plasma-etching in a $C_2F_6$-oxygen plasma. The wafers are "coin-stacked" such that only the edges of the wafers are exposed to the plasma. Other techniques could be considered for removing the silicon nitride, including abrasion or a high-velocity waterjet method.

As described above the exposed Si-edges are plated with first a seed layer and then a thicker base layer of electroless plated nickel. In the following step these nickel-plated edges of the wafer will make a good electrical contact to the plating jig during the electrolytic copper plating process.

After the electroless nickel plating the grooves are filled in the electrolytic copper plating process using a conventional electrolytic bath based on copper sulphate ($CuSO_4.5H_2O$) and sulphuric acid ($H_2SO_4$) and further comprising a levelling additive and a suppressing additive and using substantially constant cell voltage.

Levelling additives (levellers) which have been found to be useful in the process of the present invention include compounds containing thiocarbamide group(s) (—C(S)—NH—) or its corresponding tautomeric mercapto form. Examples of these compounds are thiourea and its derivatives, such as 1-ethylthiourea, 1,3-diethylthiourea, 1-phenylthiourea etc. (see for example U.S. Pat. No. 3,682,788), 2-imidazolidine-thione, 2-thiazolidinethione, 2-pyrimidinethiol etc. (see for example U.S. Pat. No. 3,542,655).

Another type of compounds useful as levelling additives in the process of the present invention are cations with a relatively high molecular weight, such as phenazonium dyestuffs, e.g. compounds known as: Janus Green, Janus Black, Neptune Blue etc. Also polymeric phenazonium compounds have shown to possess very potent levelling properties. Examples of these include poly(6-methyl-7-dimethylamino-5-phenyl-phenazonium sulphate), poly(2-methyl-7-dimethylamino-5-phenyl-phenazonium sulphate), poly(2,5,8-triphenyl-7-dimethylamino-5-phenyl-phenazonium sulphate). Also certain cationic polymers, such as polyalkylene imines, polymers and copolymers of 2-vinylpyridine and/or 2-methyl-5-vinylpyridine are useful levelling additives in the process of the present invention.

Derivatives of dithiocarbamic acid, such as N,N-diallyl-dithiocarbamic acid-n-propylester-ω-sodium sulphonate and N-alkyl-dithiocarbamic acid-n-propylester-ω-sodium sulphonate, wherein the alkyl group typically contains 1–5 carbon atoms (see e.g. U.S. Pat. No. 3,798,138) are also useful as levelling additives according to the process of the present invention.

The concentration of the above mentioned compounds in the process of the present invention typically range from 0.001 g/l to 0.05 g/l. However, the dithiocarbamic acids may be used at considerably higher concentrations. The most potent levellers of the above compounds are the phenazonium compounds.

To prevent overplating at the areas closer to the anode (e.g. at the top edges of the grooves) suppressing additives (suppressors) are further included in the electrolytic bath used in the process of the present invention. It has been found that organic disulphides of the type $R_1$—S—S—$R_2$, wherein $R_1$ and $R_2$ may be the same or different and are alkyl sulphonate groups, are very useful as suppressing additives. An example of a suppressing additive useful in the process of the present invention is bis(sodiumpropylsulfonic acid) disulfide. Typically concentrations of the suppressing additive range from 10–20 mg/l.

Optionally a carrier brightener may be included in the bath composition of the process of the present invention. The properties of a carrier brightener is to improve the performance of the other additives as well as brightness by providing uniform, small-grained, bright deposits. A group of oxygen containing high molecular weight compounds (molecular weight of 1000 to 20,000) has shown to provide excellent brightening properties. This group include polyvinyl alcohol, polyethylene glycol, polypropylene glycol, alkylphenolpolyglycolethers (the alkyl group typically being octyl, nonyl or dodecyl), polyethylene-polypropyleneglycol block polymers, and finally copolymers of ethylene oxide and propylene oxide. When included the concentration of these specific carrier brighteners amount from 0.001 to 1 g/l.

Due to the fact that the surface adjacent to the grooves has an electrically insulating layer of silicon nitride and by use of the additives it is possible to fill the grooves without voids and overplating with the electrolytic copper plating technique. Conventionally electrolytic processes are carried out at a given selected current density. By the present invention use is made of a constant cell voltage, such as 0.5–5 V or more, preferably 0.8–3 V, and more preferred 1–2 V, which means that the initial current density is low and rises rapidly as the deposits grow.

In a preferred embodiment the grooves provided in the wafer includes (i) a first group consisting of a number of essentially parallel grooves distributed mutually spaced over the major part of the light incident surface, and (ii) a second group of one or more bundles of narrowly spaced grooves intersecting the first group of grooves (i). In this case the metallisation steps provide a corresponding first group of embedded conductors and a corresponding second group of embedded conductors, which second group of conductors forms one or more bundle bus-bars electrically connected at the points of intersection to the first group of embedded conductors. Such pattern of the embedded conductors or grid line members is advantageous for the conducting and hence utilisation of the electrical current generated in the solar cell.

Preferably the exposed surface of semiconductor material in one or more of the grooves in at least one end is extended to at least a part of at least one adjacent exposed edge surface prior to the metallisation. In this way the seed layer and the electrically conducting base layer provided in steps (e) and (f), respectively, will be applied not only on the exposed surfaces in the grooves, but also on the thus communicating exposed surfaces on the edge. This ensures an electrical contact between the base layer formed in the grooves and a base layer formed on said part(s) of the edge(s) which again ensures a good electrical contact from a clamping jig of an electrolytic plating device used in the electrolytic copper plating step (g) through the base layers on the edges to the base layers in the grooves.

As already mentioned above a solar cell is also provided with a contact on the back surface. In the above described commercial buried grid solar cell prepared according to Wenham and Green (U.S. Pat. Nos. 4,748,103 and 4,726, 850) this back surface contact is provided by the deposition of aluminium on the back surface of the wafer by evaporation followed by sintering prior to the metallisation steps. In this way the electroless nickel and copper plating will also cover the aluminium deposit on the back surface as the final backside contact. A pickling step for the activation of the sintered aluminium coating on the backside may optionally be performed prior to the plating process if full metal coverage is desirable. This activation can be made by a special pretreatment comprising etching of the sintered aluminium oxide in a mixture of HF and $H_2SO_4$.

In a preferred embodiment of the present invention the inventive principle of metallisation is also used on the backside. Thus the inventive process can be carried out using a semiconductor body which has been provided with a coating of aluminium on the backside in a step preceding the application of the seed layer in step e). In this case the aluminium coating is optionally activated and the steps (e+f+g) further include application of a seed layer, a base layer and a deposit of the contact material, respectively, on the aluminium coating. In this way the electrically conducting base layers on the grooves and edge(s) and the backside are formed as an integrated electrically communicating unit in step (f) and in step (g) the contact forming material is deposited as an integrated electrically communicating deposit in the grooves, on the edge(s) and on the backside. After the metallisation steps a portion of the electrically conducting layers on the edge(s) formed in steps (e+f+g) has to be removed to eliminate a short-circuit through the electrically conducting layers on the edge(s) between the electrical contacts on the two major opposing surfaces of the semiconductor.

A preferred method for this removal of the metal (nickel and copper layers) at the edges of the solar cell after plating to avoid an electrical short-circuit is to laser-scribe a groove in the front surface or in the back surface at a small distance from the edge of the wafer, typically 1 mm, and approximately one third into the thickness of the wafer. The metallised edges of the cell are then removed by snapping-off (cleaving) the edge strips. Other methods of removing the metal from the edge might be considered, including mechanical abrasion and reactive plasma-etching.

In the above mentioned embodiment having two groups of grooves including (i) a first group consisting of a number of essentially parallel grooves distributed mutually spaced over the major part of the light incident surface, and (ii) a second group of one or more bundles of narrowly spaced grooves intersecting the first group of grooves (i), and wherein the corresponding second group of conductors forms one or more bundle bus-bars electrically connected to the first group of embedded conductors, the electrolytic plating step may be carried out under such conditions, that the jig is clamped to an electrically conducting layer on one of the edges communicating with the second group of one or more grooves and that the semiconductor body is lifted from or lowered into the electrolytic bath during the plating step (g) in such a way that grooves of the first group located at further distance from the electrically conducting layer on said edge are submerged for a longer period of time in the bath as compared to grooves of the first group closer to said edge. This ensures the desired uniform deposit in the grooves because the groove surface parts having a long distance to the jig will be immersed for a longer period of time than those parts being closer to the jig where the deposition would be higher in case of the same time of immersion.

The body of semiconductor material is preferably made of doped silicon. However, any semiconductor material can be used in the inventive solar cell. Examples of other semiconductor materials are gallium arsenide, indium phosphide, copper indium selenide and zinc oxide.

The seed layer acts as a seed for the following metallisation steps. Preferred seed layers are made of nickel or alloys thereof. Examples of other possible metals for the seed layer comprise Pd, Au, Ag, Co and Sn and alloys thereof.

The base layer may act as an inert barrier for migration by diffusion of copper into the semiconductor material because such migration is a "life-time killer" of the solar cell. Furthermore it should be sufficiently electrically conducting, should have low internal mechanical stress, and should show sufficient ductility to withstand thermal stress. As for the seed layer preferred base layers are made of nickel or alloys thereof. Examples of other possible metals for the base layer comprise Pd, Au, Ag, Co and Sn and alloys thereof.

The contact forming material filling the grooves as embedded conductors should be a material with a high conductivity. To this end the preferred material is copper.

In the present specification the two electroless plating steps have been described mainly with reference to electroless nickel plating, which is in accordance with the preferred embodiment. However other electroless metal plating using a suitable metal having good properties as seed layer and as conductive base layer, respectively, may be contemplated as well. In case of such alternative metals the plating conditions including the compositions of the baths should be adapted to the metal in question. Such adaption is within the abilities of the person skilled in the art and suitable bath systems are available on the market. Examples of alternative metals comprise Pd, Au, Ag, Co, Sn and alloys thereof including alloys with Ni.

In the same way also the electrolytic plating has been described with reference to electrolytic copper plating, which presently is the preferred embodiment. However other electrolytic metal plating using a metal having good electrical conducting properties may be contemplated as well. In case of such alternative metals the plating conditions including the composition of the bath should be adapted to the metal in question. Such adaption including the choice of levelling and suppressing additives is within the abilities of the person skilled in the art and suitable bath systems are available on the market. Examples of alternative metals for the contact forming material comprise Au, Ag, Sn and Ni.

EXAMPLE

Starting Material

Use was made of conventional wafers of silicon in the form of squares of about 13×13 cm with rounded corners and a thickness of 300 $\mu$m doped p-type. Such wafers are commercially available, for example by Bayer Solar GmbH or PV Silicon GmbH.

P-Doping and $SiN_x$ Deposition

The wafers were etched, textured and cleaned (by subsequently submerging the wafers in a base, water, an acid and water at a temperature of up to 90° C.). Then the front surface, i.e. the light incident surface, was treated with $POCl_3$ in a quartz tube furnace at about 800–900° C. to provide a layer of n-type doped silicon at the front surface by stacking the wafers in a back-to-back manner. Thereafter silicon nitride was deposited in second quartz tube furnace at 800–900° C. under low pressure by LPCVD (Low Pressure Chemical Vapour Deposition) using dichlorosilane+ $NH_3$-gas to obtain a layer of silicon nitride ($SiN_x$) on the front surface and the edges of the wafers. The layer of silicon nitride is electrically insulating, light transparent, not catalytic for electroless plating and acts as an antireflection coating for the solar cell.

The wafers were then coin stacked to protect the surfaces and leave the edges exposed to plasma etch with $C_2F_6$+ oxygen to remove the layer of silicon nitride and expose the edges.

The back surface was exposed by plasma etching.

Laser Grooving

Thereafter a number of grooves were laser cut in the front surface through the layer of silicon nitride making a grid of grooves. Each groove has a transverse cross-section comprising a rectangular part having a width of 20 $\mu$m and a depth of about 30 $\mu$m and a V- or U-shaped cross-section in the bottom giving a total depth of 40 $\mu$m. The groove pattern comprises a first group of 80 parallel grooves (1.5 mm pitch) distributed over the front surface and a second group of grooves perpendicular to the first group and joined in two bundles with a distance of about 6 cm from each other. Each bundle comprises 14 parallel grooves within a width of about 1.5 to 2 mm.

The laser cut grooves penetrate through the submicron silicon nitride layer and the n-type silicon, which means that the silicon in the grooves is largely p-type silicon. To make the n-type silicon the grooves were first etched by submerging the wafers in a base, water, an acid and water at temperatures up to 50° C. Then the surface in the grooves was treated with $POCl_3$ in a quartz tube furnace at about 1000° C. to provide a layer of n-type doped silicon in the grooves.

Aluminium Deposition

A deposit of aluminium was provided on the back surface of the wafers by PVD (Physical Vapour Deposition) and the deposit was sintered in a quartz tube furnace at 700° C.

Seed Layer

A seed layer of electroless nickel was plated on the exposed surfaces in the grooves, on the edges and on the back surface using a type AL100 bath from Enthone™-OMI. This system is a nickel sulphate based solution having a $Ni^{2+}$ content of 6 g/l and a sodium hypophosphite content of 20 g/l and further containing complexing agent and buffer. The pH of this solution was adjusted to 9.7–10 with hydroxide solution and the plating process was performed at 50–51° C. in 100 seconds. The thickness of the plated seed layer was about 0.1 $\mu$m. Then the seed layer was sintered to the silicon surface at 400° C. in an inert atmosphere of nitrogen.

Electrical Conducting Base Layer

An electrical conducting base layer of electroless nickel was plated on the top of the seed layer using an Enplate™ Ni 429 E bath from Enthone™-OMI. This system is a nickel sulphate based solution having a $Ni^{2+}$ content of 6 g/l and a sodium hypophosphite content of 20 g/l and further containing complexing agent (20 g/l), stabilisers and buffers and the plating process was performed at 75–78° C., pH 6.0–6.2, in 12 minutes. The thickness of the plated base layer was about 2 $\mu$m.

Electrolytic Copper Plating

Each wafer was fixed on a cathode jig clamping the nickel layer provided on one of the edges adjacent to the one end of the second group of grooves, i.e. those forming the two bundles of grooves. Over the nickel layers a copper plating was provided using a UBAC™ ER bath from Enthone™-OMI with a constant cell voltage of 2.0 volts in about 6 minutes. The UBAC™ ER bath solution contains 180–240 $\mu$l copper sulphate ($CuSO_4.5H_2O$), 45–90 g/l sulphuric acid ($H_2SO_4$), 20–80 mg/l chloride ion ($Cl^-$), 1.5–2.5 mil/l UBAC™ ER M Brightener and 0.1–0.5 ml/l UBAC™ ER L Brightener. This system of brighteners comprises an organic sulphur compound of the type $R_1$—S—S—$R_2$ ($R_1$ and $R_2$ being alkyl sulphonate groups) which acts as a suppressing additive, a phenazonium dye, which act as a levelling additive, and finally a carrier brightener of the type block copolymer of ethylene oxide and propylene oxide having an approximate molecular weight of 2000.

Figure 1A:
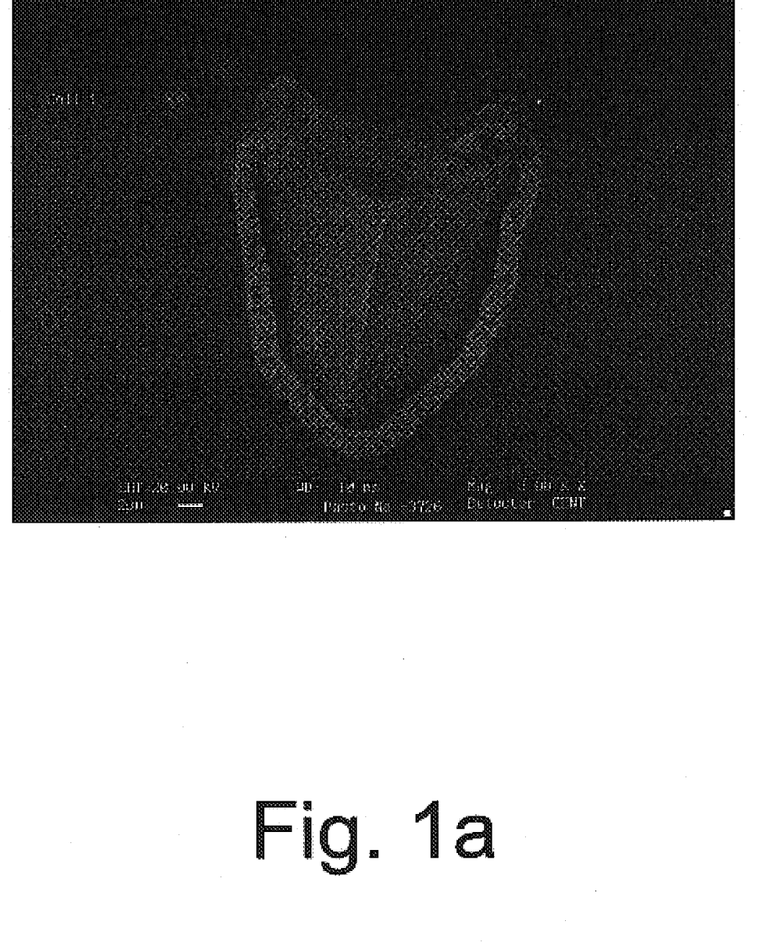
FIG. 1a is a SEM image of a groove filled by electrolytic copper plating according to the invention.

By the plating the grooves were completely filled with copper as shown on FIG. 1a and a layer of copper was deposited on the back surface and the edges.

Figure 1B:
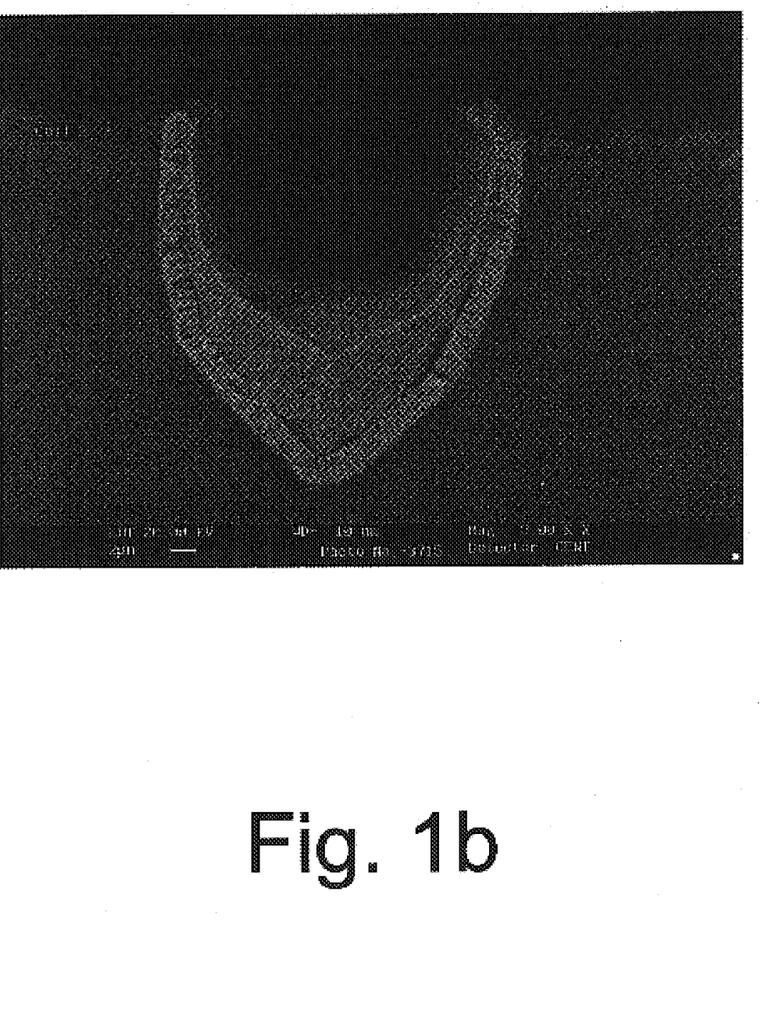
FIG. 1b is a SEM image of a groove only half filled by electrolytic copper plating according to the invention.

FIG. 1b which is a SEM image of a groove that has been filled by a process of the present invention, wherein the process was stopped half way through, shows, that the filling of the groove essentially proceeds from the bottom of said groove. In contrast FIG. 2 which is a SEM image of a groove that has filled by an electroless process of prior art shows that the filling of the groove is accompanied by formation of a void in addition to overplating on the light incident surface.

Laser Edge Isolation

The undesired electrically conductive deposits of nickel and copper on the edges were removed by laser cutting of grooves acting as lines of fracture and subsequent breaking off. In this way the short-circuit between the embedded copper contacts in the front surface and the copper contact on the backside was eliminated. A test of the solar cell demonstrated an efficiency of 16.5%.

The obtained wafers can be connected in series to form a solar cell panel.

The above description of the invention reveals that it is obvious that it can be varied in many ways. Such variations are not to be considered a deviation from the scope of the invention, and all such modifications which are obvious to persons skilled in the art are also to be considered comprised by the scope of the succeeding claims.

What is claimed is:

1. A process for the metallising of one or more contacts of a buried grid solar cell having a body of doped semiconductor material, which body has two major opposing surfaces forming a light incident surface and a backside both provided with one or more electrical contacts, and which body further has one or more edges between the major opposing surfaces, wherein the electrical contact or contacts at the light incident surface is/are formed by conducting material being arranged in a pattern of one or more grooves into the semiconductor material at the light incident surface, comprising the steps of a) providing the semiconductor body with a p/n-junction and an electrically insulating layer on the light incident surface and optionally on other surfaces, which layer is light transparent and not catalytic for electroless plating,
   b) providing an exposed surface on one or more of the edges,
   c) providing one or more grooves with a depth of 20–50 $\mu$m from the light incident surface through the insulating layer and into the semiconductor body and a width of 10–30 $\mu$m at the level of the light incident surface,
   d) doping the exposed material in the grooves obtained in step c) to reestablish the p-n-junction in the material below the surface in the grooves,
   e) applying a seed layer on the exposed semiconductor material in the grooves by electroless plating followed by sintering,
   f) applying an electrically conducting base layer by electroless plating on top of the seed layer obtained in step e), and
   g) filling the grooves with an electrically conducting contact forming material by electrolytic plating using an electrolytic bath further comprising a levelling additive to ensure a laminate growth during a build up of the electroplated layer, and a suppressing additive to inhibit a build up of the electroplated layer in areas having a higher field intensity, and using substantially constant cell voltage.

2. A process according to claim 1, wherein the grooves provided in step (c) includes i) a first group consisting of a number of essentially parallel grooves distributed mutually spaced over the major part of the light incident surface, and
   ii) a second group of one or more bundles of narrowly spaced grooves intersecting the first group of grooves (i), whereby the material provided in steps (e+f+g) forms a corresponding first group of embedded conductors and a corresponding second group of embedded conductors, which second group of conductors forms one or more bundle bus-bars electrically connected to the first group of embedded conductors.

3. A process according to claim 1, wherein the exposed surface of semiconductor material in one or more of the grooves in at least one end is extended to at least a part of at least one adjacent exposed edge surface and that the seed layer and the electrically conducting base layer provided in steps (e) and (f), respectively, are applied on the thus communicating exposed surfaces ensuring an electrical contact between the base layer formed in the grooves and a base layer formed on said part(s) of the edge(s) ensuring a good electrical contact from a clamping jig of an electrolytic plating device used in step (g) through the base layers on the edges to the base layers in the grooves.

4. A process according to claim 3, using a semiconductor body which has been provided with a coating of aluminium of the backside in a step preceding step e), wherein the aluminium coating optionally is activated by etching of the aluminium oxide layer and wherein
   steps (e+f+g) further include application of a seed layer, a base layer and a deposit of the contact forming material, respectively, on the aluminium coating, whereby electrically communicating base layers on the grooves and edge(s) and the backside are formed in step (f) and an electrically communicating deposit of the contact forming material in the grooves, on the edge(s) and on the backside is formed in step(g) and wherein a portion of the electrically conducting layers on the edge(s) formed in steps (e+f+g) are removed to eliminate a short-circuit through the electrically conducting layers on the edge(s) between the electrical contacts on the two major opposing surfaces of the semiconductor.

5. A process according to claim 3, wherein the jig is clamped to an electrically conducting layer on one of the edges communicating with the second group of one or more grooves and wherein the semiconductor body is lifted from or lowered into the electrolytic bath during step (g) in such a way that grooves of the first group located at further distance from the electrically conducting layer on said edge are submerged for a longer period of time in the bath as compared to grooves of the first group closer to said edge.

6. A process according to claim 1 wherein the contact forming material in the grooves essentially fills the grooves without overplating the electrically insulating light transparent layer.

7. A process according to claim 1 wherein the body of semiconductor material comprises a member of the group consisting of silicon, gallium arsenide, indium phosphide, copper indium selenide and zinc oxide.

8. A process according to claim 1, wherein the seed and/or the base layer(s) comprise(s) a member of the group consisting of Pd, Au, Ag, Co, Sn and Ni and an alloy thereof.

9. A process according to claim 1, wherein the contact forming layer(s) comprise(s) Cu.

10. A buried grid solar cell comprising a body of doped semiconductor material having two major opposing surfaces forming a light incident surface and a backside both provided with one or more electrical contacts and which body further has one or more edges between the major opposing surfaces, wherein the electrical contact or contacts at the light incident surface is/are formed by conducting material being arranged in a pattern of one or more grooves into the semiconductor material at the light incident surface, which light incident surface is provided with an electrically insulating light transparent coating layer interrupted by the grooves, which grooves have a depth of 20–50 $\mu$m and a width of 10–30 $\mu$m at the level of the light incident surface, and have a seed layer coating the surfaces in the grooves on the top of which the grooves have an electrically conducting base layer, on the top of which the grooves further are filled with an electrically conducting contact forming material essentially without voids and not overplating the electrically insulating light transparent layer, wherein the seed layer and the electrically conducting base layer both have been provided by electroless plating, and the electrically conducting contact forming material has been provided by electrolytic plating using substantially constant cell voltage in a electrolytic bath further comprising a levelling additive to ensure a laminate growth during a build up of the electroplated layer, and a suppressing additive to inhibit a build up of the electroplated layer in areas having a higher field intensity.

11. A solar cell according to claim 10, wherein the semiconductor material comprises a member of the group consisting of silicon, gallium arsenide, indium phosphide, copper indium selenide and zinc oxide.

12. A solar cell according to claim 10, wherein the contact forming material comprises Cu.

13. A solar cell according to claim 10, wherein the seed layer comprises a member of the group consisting of Pd, Au, Ag, Go, Sn and Ni and an alloy thereof.

14. A solar cell according to claim 10, wherein the electrically conducting base layer comprises a member of the group consisting of Pd, Au, Ag, Go, Sn and Ni and an alloy thereof.

15. A solar cell according to claim 10, wherein the body of semiconductor material is a doped wafer.

* * * * *